(12) United States Patent
Wu

(10) Patent No.: US 8,908,366 B2
(45) Date of Patent: Dec. 9, 2014

(54) ELECTRONIC DEVICE HAVING MAIN BODY AND FRONT COVER CAPABLE OF LATCHING THE MAIN BODY VIA MAGNETS

(71) Applicant: Hon Hai Precision Industry Co., Ltd., New Taipei (TW)

(72) Inventor: Shang-Feng Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 40 days.

(21) Appl. No.: 13/684,590

(22) Filed: Nov. 26, 2012

(65) Prior Publication Data

US 2013/0250497 A1  Sep. 26, 2013

(30) Foreign Application Priority Data

Mar. 23, 2012 (TW) .............................. 101110015 A

(51) Int. Cl.
*H05K 5/00* (2006.01)
*H05K 5/02* (2006.01)
*G06F 1/16* (2006.01)

(52) U.S. Cl.
CPC ............ *H05K 5/0221* (2013.01); *G06F 1/1679* (2013.01)
USPC ............... 361/679.27; 361/679.55; 292/251.5

(58) Field of Classification Search
CPC ... G06F 1/1616; G06F 1/1679; G06F 1/1613; E05C 19/16; H05K 5/0221; Y10S 292/37; H01F 7/04; G11B 23/0322; H04R 2225/023; H04R 2225/31; H04R 2460/17; H04R 25/55
USPC ....................... 361/679.01–679.61, 724–727; 292/251.5; 312/223.1–223.2; 248/917–924

See application file for complete search history.

(56) References Cited

U.S. PATENT DOCUMENTS 6,929,291 B2 * 8/2005 Chen .......................... 292/251.5
7,583,500 B2 * 9/2009 Ligtenberg et al. ...... 361/679.27

* cited by examiner

*Primary Examiner* — Anthony Haughton
*Assistant Examiner* — Ingrid Wright
(74) *Attorney, Agent, or Firm* — Novak Druce Connolly Bove + Quigg LLP

(57) ABSTRACT

An electronic device includes a main body, a front cover rotatably connected to the main body, a base, a slide guiding plate, three first magnets, and two second magnets. The main body defines a groove. The front cover defines a notch. The base is received in the groove and defines two first receiving grooves. The slide guiding plate is slidably received in the notch and defines three second receiving grooves. One of the three first magnets is received in one of the two first receiving grooves, and the other two first magnets are received in two of the three second receiving grooves respectively. One of the second magnets is receiving in the other first receiving groove, and the other second magnet is receiving in the other one of the three second receiving grooves and positioned between the two first magnets received in the two second receiving grooves.

14 Claims, 3 Drawing Sheets

ELECTRONIC DEVICE HAVING MAIN BODY AND FRONT COVER CAPABLE OF LATCHING THE MAIN BODY VIA MAGNETS

BACKGROUND

1. Technical Field

The present disclosure relates to electronic devices and, particularly, to an electronic device having latching function.

2. Description of Related Art

A laptop computer includes a main body and a front cover rotatably connected to the main body. In order to avoid the improper opening of the front cover while being carried a latching assembly is set between the main body and the front cover. However, the structures of the existing latching assemblies are complex and costly.

Therefore, it is desirable to provide an electronic device, which can overcome the above-mentioned limitations.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Figure 1:
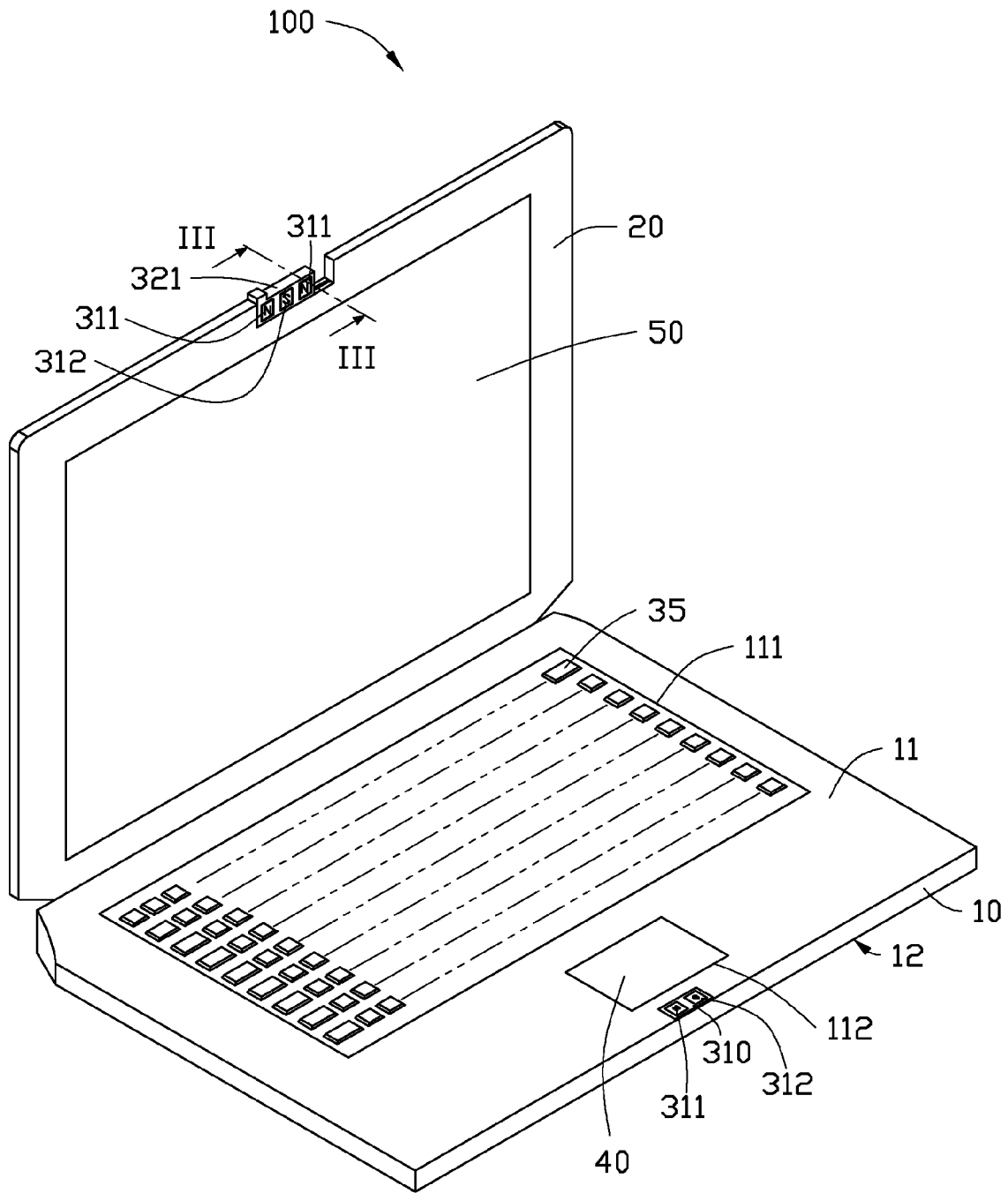
FIG. 1 is an assembled, isometric view of an electronic device, according to an embodiment.
Figure 2:
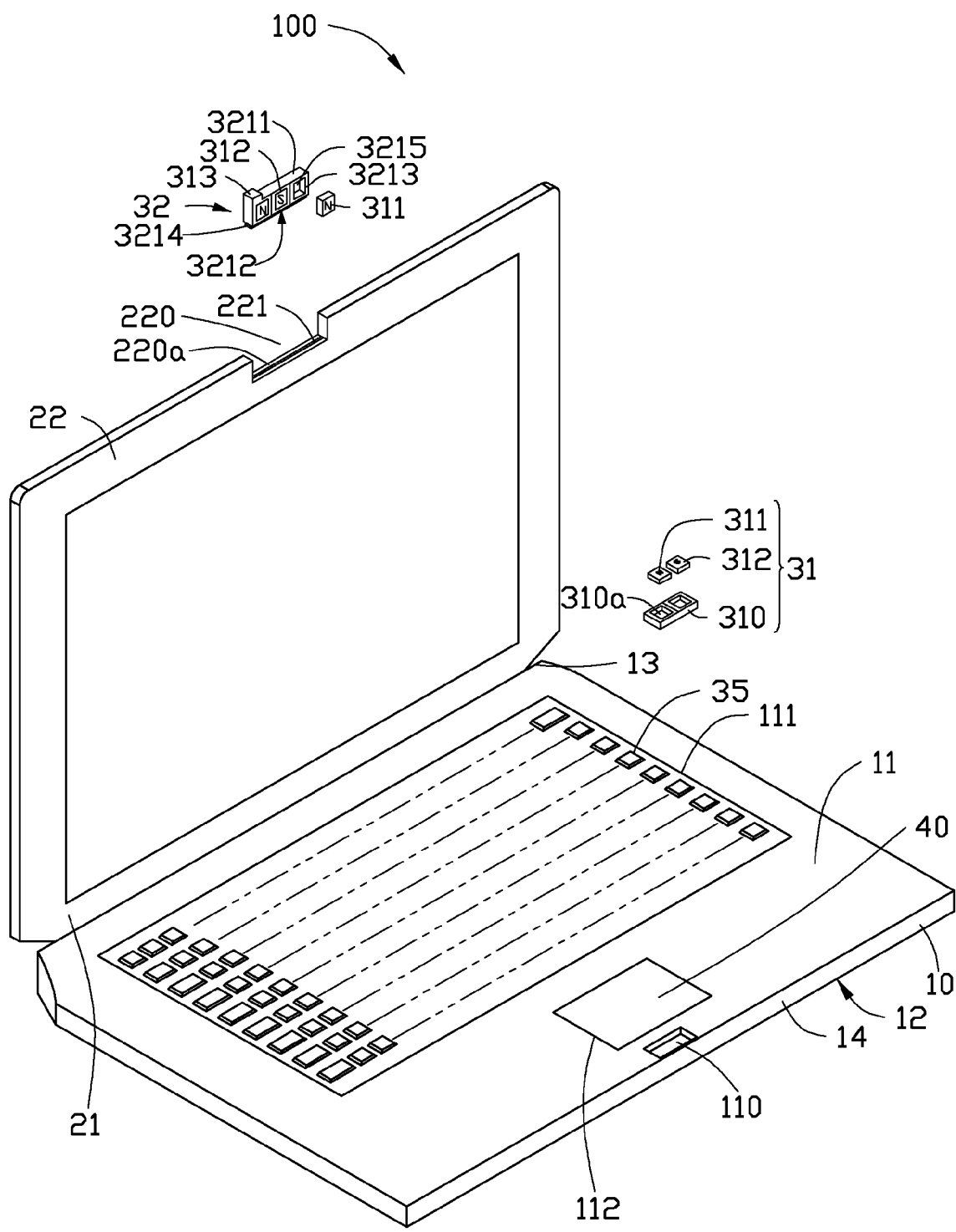
FIG. 2 is an exploded, isometric view of the electronic device of FIG. 1.
Figure 3:
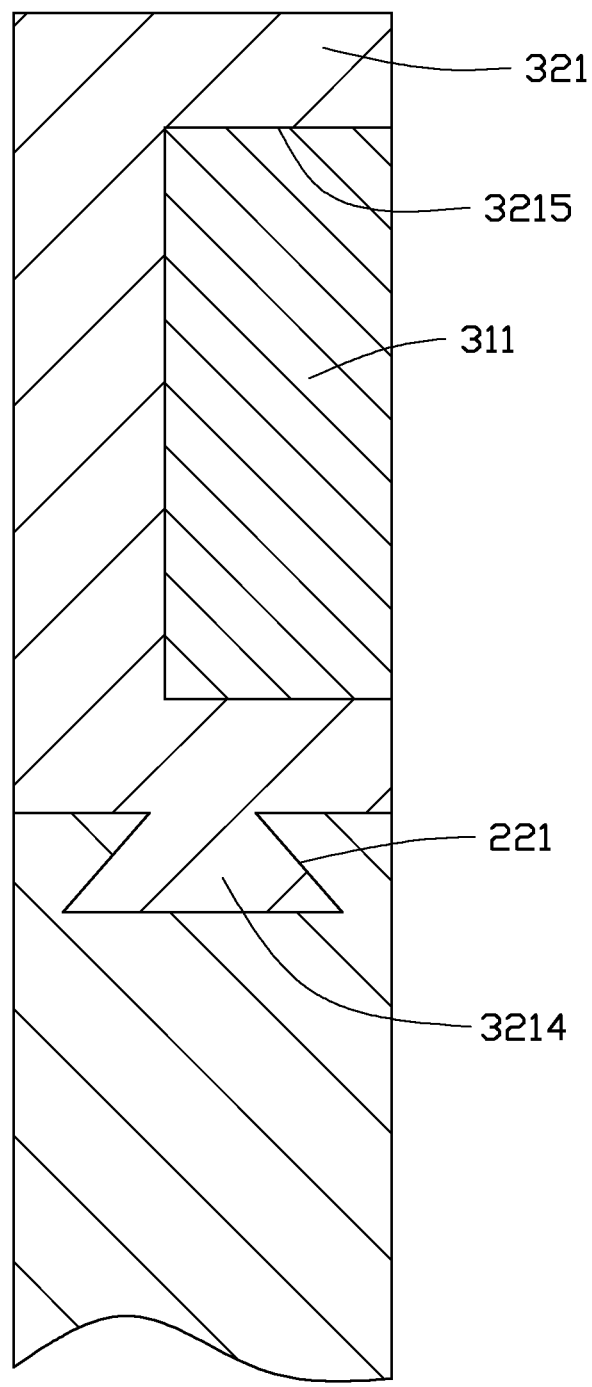
FIG. 3 is a partial cross-sectional view taken along line III-III of FIG. 1.

FIGS. 1-3 illustrate an electronic device 100 according to an exemplary embodiment. The electronic device 100 includes a main body 10, a front cover 20 rotatably connected to the main body 10, a first magnetic member 31 mounted in the main body 10, and a second magnetic member 32 mounted in the front cover 20.

The main body 10 is rectangular in shape and includes a top surface 11 and a bottom surface 12 facing away from the top surface 11. The top surface 11 includes a keyboard mounting area 111 and a touch panel mounting area 112. A number of key buttons 35 are mounted on the keyboard mounting area 111. A touch panel 40 is mounted in the touch panel mounting area 112. The main body 10 also includes a first sidewall 13 hinging with the front cover 20 and a second sidewall 14 facing away from the first sidewall 13. The top surface 11 defines a groove 110 close to the second sidewall 14.

A display panel 50 is mounted in the front cover 20. The front cover 20 includes a rotating end 21 hinging with the first sidewall 13 and a free end 22 facing away from the rotating end 21. The free end 22 defines a notch 220. The location of the notch 220 spatially corresponds to the location of the groove 110. A bottom surface 220a of the notch 220 defines a trapezoidal guiding slot 221. A width of one end of the guiding slot 221 coplanar with the bottom surface 220a of the notch 220 is smaller than a width of the other end of the guiding slot 221, in a direction perpendicular to a lengthwise of the free end 22. The two ends of the guiding slot 221 are opposite to each other.

The first magnetic member 31 includes a base 310, a first magnet 311, and a second magnet 312. The shape and size of the base 310 respectively corresponds to the shape and size of the groove 110. The base 310 is fixedly received in the groove 110. The base 310 defines two first receiving grooves 310a. The first magnet 311 and the second magnet 312 are fixedly received in the two first receiving grooves 310a, respectively. The base 310 is made of a non-magnetizable material. In the embodiment, the non-magnetizable material is plastic.

The second magnetic member 32 includes a slide guiding plate 321, two first magnets 311, and one second magnet 312. The slide guiding plate 321 is also made of non-magnetizable material, and includes a top portion 3211, a bottom portion 3212 facing away from the top portion 3211, and a sidewall 3213 connected to both the top portion 3211 and the bottom portion 3212. A pushing portion 313 perpendicularly extends upward from the top portion 3211. A trapezoidal flange 3214 extends downward from the bottom portion 3212. The shape and size of the flange 3214 respectively corresponds to the shape and size of the guiding slot 221. As such, the flange 3214 is received in the guiding slot 221 and can slide in the guiding slot 221, and the slide guiding plate 321 can slide in the notch 220.

The sidewall 3213 of the slide guiding plate 321 defines three second receiving grooves 3215 in a line. The two first magnets 311 and one second magnet 312 respectively receive in the three second receiving grooves 3215, and the second magnet 312 is positioned between the two first magnets 311. The stroke length of the slide guiding plate 321 sliding within the notch 220 is equal to the length of the second receiving grooves 3215. A polarity of one end of each first magnet 311 that is exposed and a polarity of one end of each second magnet 312 that is exposed are opposite to each other. The shape and size of each first magnet 311 respectively correspond to the shape and size of each second magnet 312. The shape and size of the first receiving grooves 310a respectively correspond to the shape and size of the second receiving grooves 3125. A distance between two adjacent first receiving grooves 310a is substantially equal to a distance between two adjacent second receiving grooves 3125.

In use, when a user pushes the pushing portion 313, the slide guiding plate 321 slides toward one sidewall of the notch 220, then the front cover 20 may be rotated to cover the main body 10. In this state, the first magnet 311 of the first magnetic member 31 aligns with the second magnet 312 of the second magnetic member 32. As such, the first magnet 311 of the first magnetic member 31 and the second magnet 312 of the second magnetic member 32 are magnetized, and the front cover 20 and the main body 10 are attracted each other. The second magnet 312 of the first magnetic member 31 is aligned with one of the first magnets 311 of the second magnetic member 32, thereby further enhancing the strength between the main body 10 and the front cover 10.

When the user wants to open the front cover 20, the pushing portion 313 may be pushed to make the slide guiding plate 321 slide toward the other sidewall of the notch 220. In this state, the first magnet 311 of the first magnetic member 31 aligns with one of the first magnets 311 of the second magnetic member 32. In addition, the second magnet 312 of the first magnetic member 31 aligns with the second magnet 312 of the second magnetic member 32, as such, the front cover 10 and the main body 10 are unlatched from each other.

It will be understood that the above particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. An electronic device, comprising:
a main body defining a groove;
a front cover hinging with the main body, the front cover defining a notch, the notch comprising a bottom surface, the bottom surface defining a guiding slot;
a base fixedly received in the groove, the base defining two first receiving grooves;
a slide guiding plate slidably received in the notch, the slide guiding plate defining three second receiving grooves, the slide guiding plate comprising a flange, the flange extending downward from a bottom portion of the slide guiding plate, and the flange being slidably received in the guiding slot;
three first magnets, one of the three first magnets received in one of the two first receiving grooves, the other two first magnets received in two of the three second receiving grooves respectively; and
two second magnets, one of the two second magnets receiving in the other one of the two first receiving grooves, the other second magnet receiving in the other one of the three second receiving grooves and positioned between the two first magnets received in the two second receiving grooves.

2. The electronic device of claim 1, wherein both the guiding slot and the flange are trapezoidal.

3. The electronic device of claim 1, wherein the main body is rectangular in shape and comprises a top surface and a bottom surface facing away from the top surface, the top surface comprises a keyboard mounting area and a touch panel mounting area, the main body comprises a plurality of key buttons and a touch panel, the key buttons are mounted on the keyboard mounting area, and the touch panel is mounted in the touch panel mounting area.

4. The electronic device of claim 1, wherein the main body comprises a first sidewall hinging with the front cover and a second sidewall facing away from the first sidewall, the top surface defines the groove close to the second sidewall.

5. The electronic device of claim 4, wherein the front cover comprises a rotating end hinging with the first sidewall and a free end facing away from the rotating end, the free end defines the notch, the location of the notch corresponds to the location of the groove.

6. The electronic device of claim 1, comprising a display panel mounted in the front cover.

7. The electronic device of claim 1, wherein the slide guiding plate comprises a top portion and a pushing portion, and the pushing portion perpendicularly extends upward from the top portion.

8. The electronic device of claim 1, wherein both the base and the slide guiding plate are made of a non-magnetizable material.

9. The electronic device of claim 1, wherein both the base and the slide guiding plate are made of plastic.

10. The electronic device of claim 1, wherein a stroke length of the slide guiding plate sliding within the notch is equal to a length of the second receiving grooves.

11. The electronic device of claim 1, wherein a polarity of one end of each of the first magnets that is exposed and a polarity of one end of each of the second magnets that is exposed are opposite to each other.

12. The electronic device of claim 1, wherein the shape and size of each first magnet respectively correspond to the shape and size of each second magnet.

13. The electronic device of claim 1, wherein the shape and size of each first receiving groove respectively correspond to the shape and size of each second receiving groove.

14. The electronic device of claim 1, wherein a distance between the two first receiving grooves is substantially equal to a distance between two adjacent second receiving grooves.

* * * * *